United States Patent [19]
Vandenberghe et al.

[11] Patent Number: 4,590,430
[45] Date of Patent: May 20, 1986

[54] APPARATUS FOR MONITORING CELL CAPACITY IN A STORAGE BATTERY

[75] Inventors: Claude Vandenberghe; André Le Morvan, both of St Quentin, France

[73] Assignee: Electricite de France (Service National), Paris, France

[21] Appl. No.: 558,792

[22] Filed: Dec. 7, 1983

[30] Foreign Application Priority Data

Dec. 13, 1982 [FR] France .................. 82 20859

[51] Int. Cl.⁴ ........................................... G01N 27/46
[52] U.S. Cl. .................................... 324/427; 324/434
[58] Field of Search .............. 340/636; 320/15, 17, 320/43, 48; 324/425, 426, 427, 433, 434, 435

[56] References Cited

U.S. PATENT DOCUMENTS

| | | | |
|---|---|---|---|
| 2,621,231 | 12/1952 | Medlar et al. | 324/434 |
| 3,487,295 | 12/1969 | Nocera et al. | 324/434 |
| 3,586,962 | 6/1971 | Rebstock | 324/434 |
| 3,942,104 | 3/1976 | Byrne | 324/434 |
| 3,971,980 | 7/1976 | Jungfer | 324/434 |
| 4,044,300 | 8/1977 | Dupuis | 324/434 |
| 4,352,067 | 9/1982 | Ottone | 324/434 |
| 4,484,140 | 11/1984 | Dieu | 324/434 |

Primary Examiner—Michael J. Tokar

[57] ABSTRACT

Apparatus for monitoring the capacity of a battery of series-connected storage cells (10) which are tested by discharging the battery at constant current. The apparatus comprises: sequencer means (30, 40, 50) for cyclically addressing each battery cell in turn, and delivering a single measurement signal ($V_M$) representative of the voltage across the terminals of the cell being addressed; comparator means (60) connected to receive said single measurement signal and to deliver an active output condition when said single measurement signal ($V_M$) is below a threshold value ($V_{REF}$) representing the end-of-discharge voltage for the cells under test; and timer means (90, 91) responsive to said active output condition to indicate the discharge time of the cell responsible for causing said active output condition to be delivered.

Cyclic operation of the apparatus is interrupted each time a cell is encountered with less than the threshold voltage across its terminals. An operator then takes the discharged cell out of the battery circuit and operates enabling means (58) to cause cyclic testing to continue on the remaining cells. The process may continue until all the cells have been discharged.

7 Claims, 1 Drawing Figure

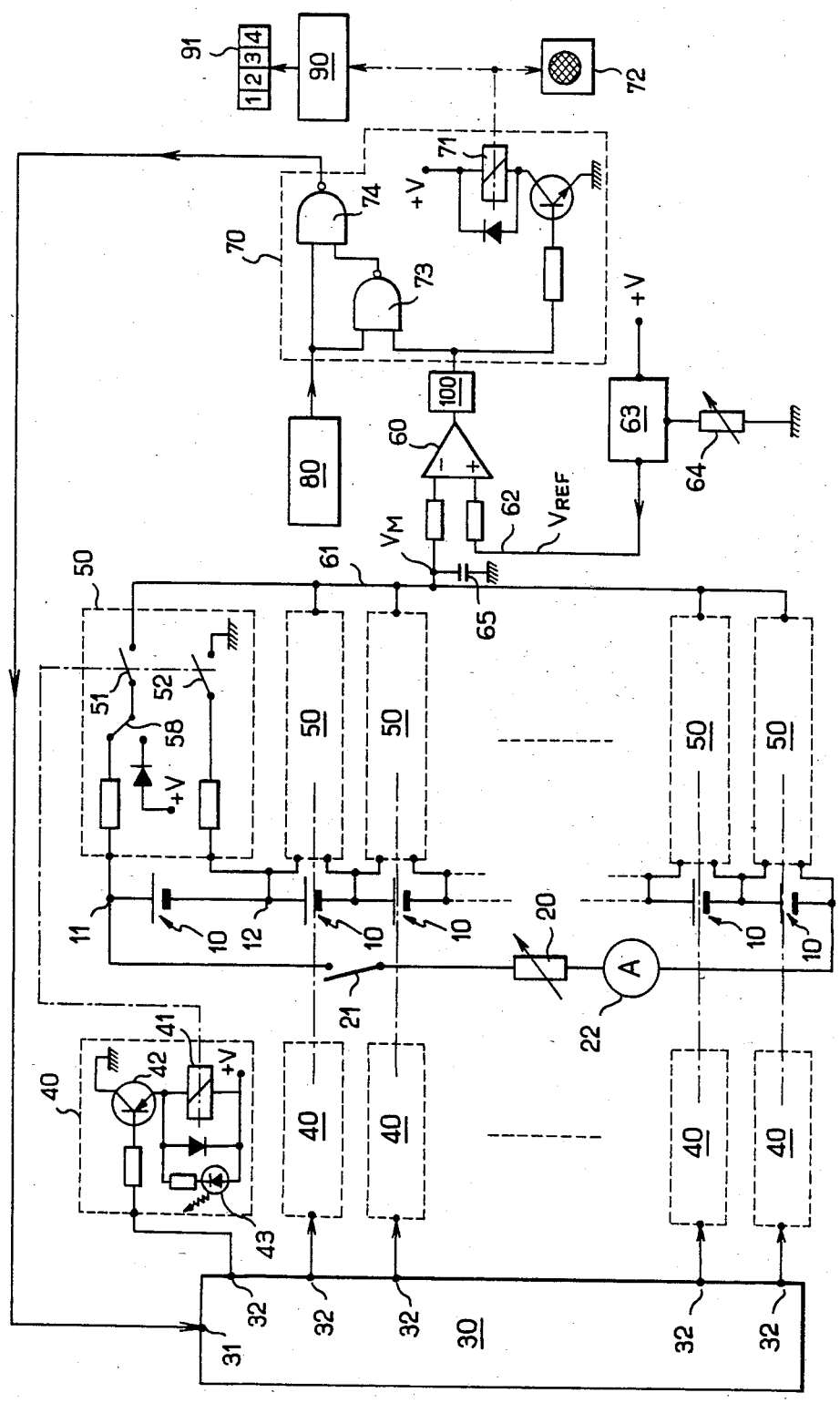

APPARATUS FOR MONITORING CELL CAPACITY IN A STORAGE BATTERY

The present invention relates to apparatus for monitoring cell capacity in a storage battery, and in particular in storage batteries installed in electricity distribution stations.

BACKGROUND OF THE INVENTION

Regulations in force require that the capacity of such batteries be periodically verified. This verification is performed by continuously discharging the battery through a rheostat connected across its terminals in order to keep the discharge current to a constant value. As soon as the voltage across any individual cell drops below a given threshold, that cell is disconnected from the battery and is no longer discharged. Discharging continues for the rest of the battery, with the current being kept to the same constant value.

Each time a cell is disconnected, the time it took to discharge is noted. Given that both the time to discharge and the constant discharge current are known for each cell, it is possible to calculate the quantity of electricity given back by each cell, ie. its capacity.

However, the actual procedure is tedious and dangerous. It is tedious since the operator must continuously measure the cell voltages using a voltmeter throughout the entire period of discharge. A discharge cycle lasts for a long time (about 5 to 10 hours), and the number of cells to be individually tested is high (for example, commonly used batteries in the electricity power supply industry are 48 volt batteries and 127 volt batteries, comprising 24 and 58 cells respectively).

The procedure is also dangerous in that the operator is continually working on apparatus having a dangerous voltage across its end terminals (eg. 48 or 127 volts) and must thus perform the test measurements while wearing protective gloves.

Preferred embodiments of the present invention avoid the need for manual test measurements by warning an operator each time an individual cell has been discharged, ie. that the voltage across its terminals has dropped below a predetermined threshold. The operator may then stop discharging. Apparatus in accordance with the invention may also indicate which cell is discharged together with the time elapsed since discharging began. The operator can then readily disconnect the cell in question, note the corresponding discharge time, and cause discharging to continue until the apparatus detects that another cell has been discharged.

The cycle continues in this manner until the last battery cell has been discharged.

SUMMARY OF THE INVENTION

The present invention provides apparatus for monitoring the capacity of a battery of series-connected storage cells, said battery being discharged at constant current when under test, the improvement wherein the apparatus comprises:

sequencer means for cyclically addressing each battery cell in turn, said sequencer means being suitable for delivering a single measurement signal ($V_M$) representative of the voltage across the terminals of the cell being addressed;

comparator means connected to receive said single measurement signal and to deliver an active output condition when said single measurement signal ($V_M$) is below a threshold value ($V_{REF}$) representing the end-of-discharge voltage for the cells under test; and timer means responsive to said active output condition being delivered by said comparator means to indicate the discharge time of the cell responsible for causing said active output condition to be delivered.

The apparatus may also include:

inhibiting means for suspending cyclic operation of the sequencer means when the comparator means detect a voltage below the threshold;

indicator means to indicate which cell is being addressed by the sequencer means;

enabling means for enabling cyclic operation to restart after being inhibited by the inhibiting means.

BRIEF DESCRIPTION OF THE DRAWING

An embodiment of the invention is described by way of example with reference to the sole FIGURE of the accompanying drawing which is a circuit diagram.

DESCRIPTION OF THE PREFERRED EMBODIMENTS

A battery to be verified comprises a plurality of individual cells 10 connected in series, with the battery as a whole being connectable via a normally open switch 21 to discharge through a rheostat 20. An ammeter 22 indicates the value of the discharge current and is used to keep this value constant.

By way of example, the battery may be supposed to comprise 58 cells connected in series giving a nominal tension of 127 volts. Each cell gives a nominal 2.2 volts and is considered to be discharged when the voltage across its terminals drops to a threshold value of 1.8 volts.

A 127 volt battery having a capacity of 100 Ah has a discharge time of about 5 h at a constant current of 20 amps.

A sequencer circuit comprises a ring counter 30 having a clock input 31 connected to receive pulses from a clock circuit 80, which delivers one pulse every 24 milliseconds, for example.

The outputs 32 from the ring counter are activated cyclically and successively. Each of the outputs 32 is connected to a respective control circuit 40 comprising a relay 41 controlled by a transistor 42.

The relays provide galvanic isolation between the control circuits 40 and respective measuring circuits 50. A measuring circuit 50 is connected across the terminals 11, 12 of each cell 10. First and second normally open contacts 51 and 52 of the corresponding relay 40 connect the terminals of each cell when it is addressed by the sequencer circuit 30 to a common bus 61 which is connected to the inverting input of a comparator circuit 60.

Further, each time a relay 41 is activated, an associated light emitting diode (LED) 43 connected across the terminals of the relay is turned on. The particular cell being addressed by the sequencer at any moment, ie. the cell on which a test measurement is being performed, is thus indicated by the corresponding LED emitting light.

The voltage $V_M$ present on the bus 61 is thus a multiplexed voltage which is representative of the voltage across the terminals of each of the cells in turn.

The other, non-inverting input 62 of the comparator 60 is maintained at a constant reference voltage $V_{REF}$ representative of the threshold voltage corresponding to an individual cell being discharged (ie. 1.8 volts in the present example).

The reference voltage is obtained from a power supply voltage V by means of an integrated voltage regulator which is set by means of an adjustable resistance 64.

A capacitor 65 connected between the inverting input to the comparator 60 and ground acts as a short term memory for avoiding sharp changes in the multiplexed voltage each time the sequencer circuit advances one step.

The output from the comparator 60 (which goes active when the voltage across the cell being tested is less than the threshold voltage) controls a circuit 70 via a monostable 100.

The circuit 70 includes a relay 71 which is connected to actuate an alarm 72 for warning an operator, who can then open the switch 21, and thus turn off battery discharge. The output from the comparator 60 is also applied in the circuit 70 to a first input of a series connection of two NAND gates 73 and 74. The appearance of the active condition at the output from the comparator 60 has the effect of interrupting the clock pulses coming from the clock circuit 80. The ring counter 30 which is driven by these pulses is thus stopped. The relay 71 also stops operation of a timer 90, thereby stopping its output display at a value indicative of the discharge time elapsed since the beginning of the discharge test.

Finally, each measuring circuit 50 includes a switch 58 to enable the operator to switch in a positive DC voltage V which is greater than the threshold voltage to replace the cell voltage when a cell is taken out of circuit.

The apparatus operates as follows: initially all of cells 10 are connected in series and the battery is discharged via the rheostat 30, which the operator adjusts to obtain a constant discharge current. The relays 41 are successively activated by the sequencer 30, and so long as none of the cell voltages drops below the threshold voltage, the comparator 60 does not produce an active condition at its output. The NAND gates 73 and 74 remain open and the timer continues to operate.

When the voltage across one of the cells drops below the predetermined threshold, the output from the comparator assumes an active condition, thereby interrupting the transmission of clock pulses from the clock 80 and thus stopping the sequencer 30. At the same time the relay 71 is actuated, thereby triggering the alarm 72 and stopping the timer 90.

The operator then opens the switch 21 to stop discharging and observes which one of the LEDs 43 is emitting light, indicating which cell has been discharged. The operator then disconnects the discharged cell, reconnects the remaining cells in series, and, to restart the test, closes the corresponding switch 58, thereby applying a permanent voltage above the threshold for forwarding to the comparator whenever the disconnected cell is subsequently addressed by the sequencer 30.

The effect of disactivating the below-threshold voltage by means of the switch 58 is to stop the alarm 72, to restart the timer 90, and to restart cyclic operation of the sequencer 30 (because the gates 73 and 74 are reopened).

The operator then manually recloses the switch 21 and resets the rheostat so that discharging continues at its previous constant current.

The cells remaining in circuit are then cyclically scanned until another cell voltage drops below the discharge threshold. it will be observed that the measurement circuit 50 corresponding to the previously disconnected cell does not interfere with the cyclic scanning, since the voltage V applied via the switch 58 in place of the disconnected cell voltge is above the threshold voltage.

We claim:

1. Apparatus for monitoring the capacity of a battery of series-connected storage cells, said battery being discharged at constant current when under test, and cells of said battery being successively disconnected from said battery when the voltage across the corresponding cell drops below a predetermined threshold, the discharging further continuing for the rest of the battery with the current being kept to the same constant value, comprising:
   (a) sequencer means for cyclically addressing each battery cell in turn, said sequencer means being suitable for delivering a single measurement signal representative of the voltage across terminals of the cell being addressed;
   (b) comparator means connected to receive said single measurement signal and to deliver an active output condition when said single measurement signal is below a threshold value representing end-of-discharge voltage for the cells under test;
   (c) inhibiting means for suspending operation of said sequencer means while said comparator means are delivering said active output condition;
   (d) timer means responsive to said active output condition being delivered by said comparator means to indicate the discharge time of the cell responsible for causing said active output condition to be delivered; and
   (e) enabling means for disabling said inhibiting means, so as to enable said sequencer means to restart operation after said operation has been suspended by said inhibiting means and said responsible cell has been disconnected from said battery.

2. The apparatus according to claim 1, further comprising indicator means for indicating which one of said cells is being addressed by said sequencer means.

3. The apparatus according to claim 1, said enabling means comprising means for substituting a permanent voltage greater than said threshold voltage in place of the voltage measured across the terminals of the discharged cell.

4. The apparatus according to claim 1, wherein said sequencer means include a series of relays which are cyclically actuated to connect the terminals of respective corresponding cells to input terminals of said comparator means for receiving said single measurement signal.

5. The apparatus according to claim 4, further comprising indicator means for indicating which one of said cells is being addressed by said sequencer means, wherein each of said relays is associated with a respective indicator lamp, wherein said lamp is connected in such a manner as to be turned on at the same time as the corresponding relay is actuated.

6. The apparatus according to claim 1, wherein said sequencer means include a ring counter driven by clock pulses from a clock circuit.

7. The apparatus according to claim 6, further comprising inhibiting means for suspending operation of said sequencer means by interrupting the application of said clock pulses thereto.

* * * * *